United States Patent [19]

Waldrop et al.

[11] Patent Number: 4,999,685
[45] Date of Patent: Mar. 12, 1991

[54] SCHOTTKY BARRIER HEIGHT FOR METAL CONTACTS TO III-V SEMICONDUCTOR COMPOUNDS

[75] Inventors: James R. Waldrop; Ronald W. Grant, both of Thousand Oaks, Calif.

[73] Assignee: United States of America as represented by the Secretary of the Air Force, Washington, D.C.

[21] Appl. No.: 353,271

[22] Filed: May 16, 1989

[51] Int. Cl.$^5$ .................. H01L 29/48; H01L 29/161; H01L 29/80
[52] U.S. Cl. ........................................ 357/15; 357/16; 357/22
[58] Field of Search ............................. 357/15, 16, 22

[56] References Cited
U.S. PATENT DOCUMENTS 4,706,104 11/1987 Switzer .................................. 357/15
4,794,444 12/1988 Liu et al. ............................... 357/16

Primary Examiner—Rolf Hille
Assistant Examiner—Wael Fahmy
Attorney, Agent, or Firm—Stanton E. Collier; Donald J. Singer

[57] ABSTRACT

A metal to semiconductor contact is provided wherein the Schottky barrier height is about 1 eV and independent of the contact metal. The metal, such as Au, Cr, or Ti, is deposited on a heavily doped p-type layer of silicon which is about 15 to 30 angstroms thick. The interface layer is deposited on gallium arsenide.

8 Claims, 1 Drawing Sheet

4,999,685

SCHOTTKY BARRIER HEIGHT FOR METAL CONTACTS TO III-V SEMICONDUCTOR COMPOUNDS

STATEMENT OF GOVERNMENT INTEREST

The invention described herein may be manufactured and used by or for the Government for governmental purposes without the payment of any royalty thereon.

BACKGROUND OF THE INVENTION

The present invention relates to semiconductor devices, and in particular, to metal contacts to III-V semiconductor material.

A metal-semiconductor contact has a potential barrier, namely a Schottky barrier, which can be modified by appropriate doping, etc. so that this contact may be either a rectifying contact or a resistive contact depending on the application in an integrated circuit. Thus modification of the Schottky barrier is of concern.

For example, U.S. Pat. No. 4,394,673 which is incorporated by reference discloses providing silicide contacts on a silicon substrate wherein the barriers are either greater than 0.8 eV or lower than 0.4 eV. Rare earths are deposited as thin films on silicon and heated there to form the silicide layer.

In another example, U.S. Pat. No. 4,796,082 which is incorporated by reference makes a low resistive contact on a GaAs substrate when indium diffuses into the gallium arsenide substrate to form a uniform layer of InGaAs. A layer of nickel is initially interposed between the indium and the substrate.

Although the above satisfy the noted objectives, one would like to be able to tailor the Schottky barrier height for a maximum value independent of the contact metal.

SUMMARY OF THE INVENTION

A contact of metal such as gold, chromium or titanium to a semiconductor substrate such as gallium arsenide or indium phosphide is able to maximize the Schottky barrier height $\phi_B$ with a very thin silicon interface layer. The contact layer is a thick metal such as noted above and the interface layer of silicon of thickness from about 15 to 30 Å. For large $\phi_B$ contacts the silicon interface is heavily doped p-type with gallium or boron. With the above contact structure, metal—silicon—semiconductor material, the Schottky barrier height can be made essentially independent of the contact metal and maximized to about 1 eV.

It is therefore one object of the present invention to provide a contact for an integrated circuit wherein the Schottky barrier height can be maximized to provide an appropriate $\phi_B$.

Another object of the present invention is to provide a contact for a III-V compound semiconductor having a Schottky barrier height of about 1.0 eV and independent of the contact metal.

These and many other objects and advantages of the present invention will be readily apparent to one skilled in the pertinent art from the following detailed description of a preferred embodiment of the invention and the related drawings.

Inset shows relationship between As 3d binding energy and $E_F^i$.

Figure 2:
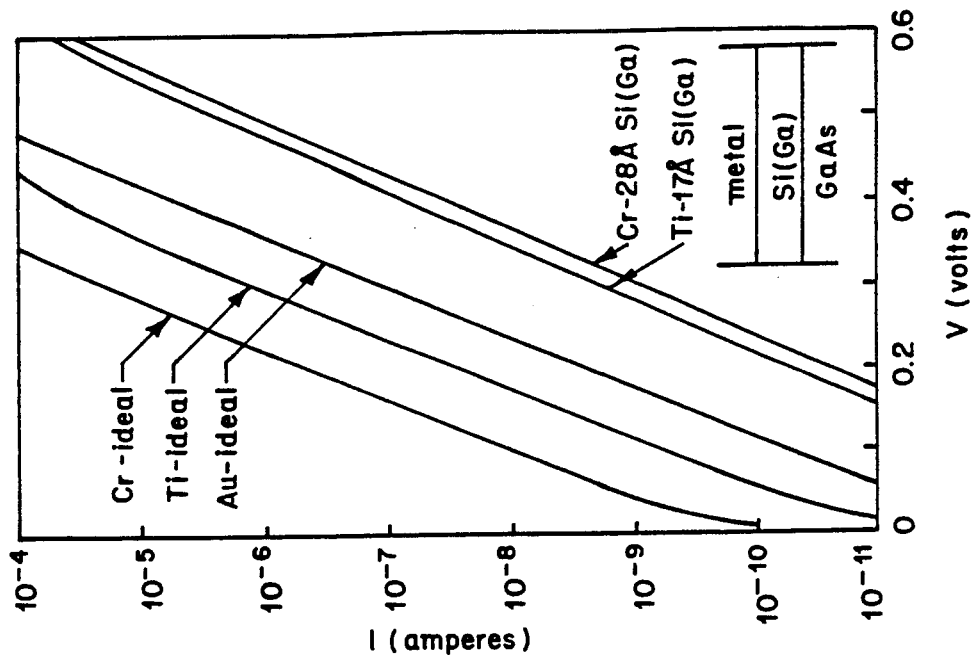

FIG. 2 representative I-V data for Cr-Si(Ga) and Ti-Si(Ga) contacts compared to corresponding ideal contacts [AuSi(Ga) data not shown because overlap with CrSi(Ga) data]. Contact area = $5.07 \times 10^{-4}$ cm$^2$.

DETAILED DESCRIPTION OF THE PREFERRED EMBODIMENT

The metal contact to GaAs commonly used in device applications generally exhibit a restricted range of Schottky barrier height $\phi_B$ that is between ~0.7 and 0.9 eV. The performance of many GaAs device designs which include Schottky barrier contacts is improved, however, if a larger $\phi_B$ contact can be employed. Some unconventional Schottky barrier contacts where $\phi_B$ is ~1 eV have been reported; for example, polymeric (SN)$_x$,[1] amorphous Si-Ge-B material, and Au with interface chalcogen. Thus, an upper limit for $\phi_B$ established for ideal metal contacts (no interface oxide) is not an intrinsic property of all GaAs Schottky barrier interfaces.

In the present invention a 1 eV $\phi_B$ metal Schottky barrier contact to GaAs is accomplished by influencing the interface Fermi energy $E_F^i$ with a very thin Si interlayer. The metals investigated are Au, Cr, and Ti. The contact structure consists of a thick metal and a ~15-30 Å Si interface layer made heavily p-type with Ga. During initial contact formation $E_F^i$ and the interface composition were observed by x-ray photoemission spectroscopy (XPS). For thick contacts, $\phi_B$ was measured by current-voltage (I-V) and capacitance-voltage (C-V) techniques on the same interfaces characterized by XPS. The XPS, I-V, and C-V measurements gave consistent results.

The contacts were prepared in the ultrahigh vacuum environment ($10^{-10}$ Torr range base pressure) of an XPS apparatus that consists of a HP5950 electron spectrometer (hv = 1486.6 eV monochromatic x-ray source, and a ~16 Å effective photoelectron escape depth) and a custom sample preparation chamber. XPS spectra of the As 3d, Ga 3d, and of other appropriate core levels were obtained at different stages of initial contact interface formation. Electrical measurements were made with a computerized system that includes a HP4140pA meter/voltage source and a HP4275A capacitance meter.

The GaAs used was (100) Bridgman-grown n-type ($5. \times 10^{16}$ cm$^{-3}$Si) wafers. To prepare a base layer, a 8X8 mm GaAs piece is etched in fresh 4:1:1 H$_2$SO$_4$:H$_2$O$_2$:H$_2$O solution for ~30 s to remove polishing damage, mounted on a Mo plate with In, and immediately put into the XPS system. The native oxide is removed from the GaAs surface by momentary heating to the minimum necessary temperature (~575° C.) This thermally cleaned surface is free of O and C (as shown by XPS), and is ordered (exhibits a characteristic low-energy electron diffraction pattern). The Si interface layer evaporation source was a Ta basket filled with heavily p-type (B) Si. The Ga evaporation source was a miniature W basket located near the sample. Au, Cr, and Ti contact layer metals were evaporated from W baskets. After XPS analysis of an initial thin metal overlayer (~10–15 Å), a final thick metal layer of >2000 Å was deposited. An array of circular 2.54×10$^{-2}$ cm diameter contacts was defined by photolithography and etching. The electrical measurements were thus taken on the same interfaces characterized by XPS.

The Si interface layers which ranged from 17 to 28 Å, were deposited at ~0.1 Å/s onto clean GaAs surfaces held at 250° C. (the layer thickness was measured by noting the attenuation of the As 3d peak from the GaAs substrate layer). Low $E_F^i$ (large $\phi_B$) results were obtained most consistently when both a monolayer of Ga was deposited during the first few seconds of the Si overlayer growth and the chamber was backfilled with ~2×10$^{-6}$ Torr H2. This amount of Ga is in excess of what can be incorporated into Si films in the thickness range used, thus ensuring that sufficient p-type dopant is available to produce degeneracy. The resultant Si layer is designated Si(Ga). The hydrogen background seems to assist in making the Si films p-type.

Figure 1:
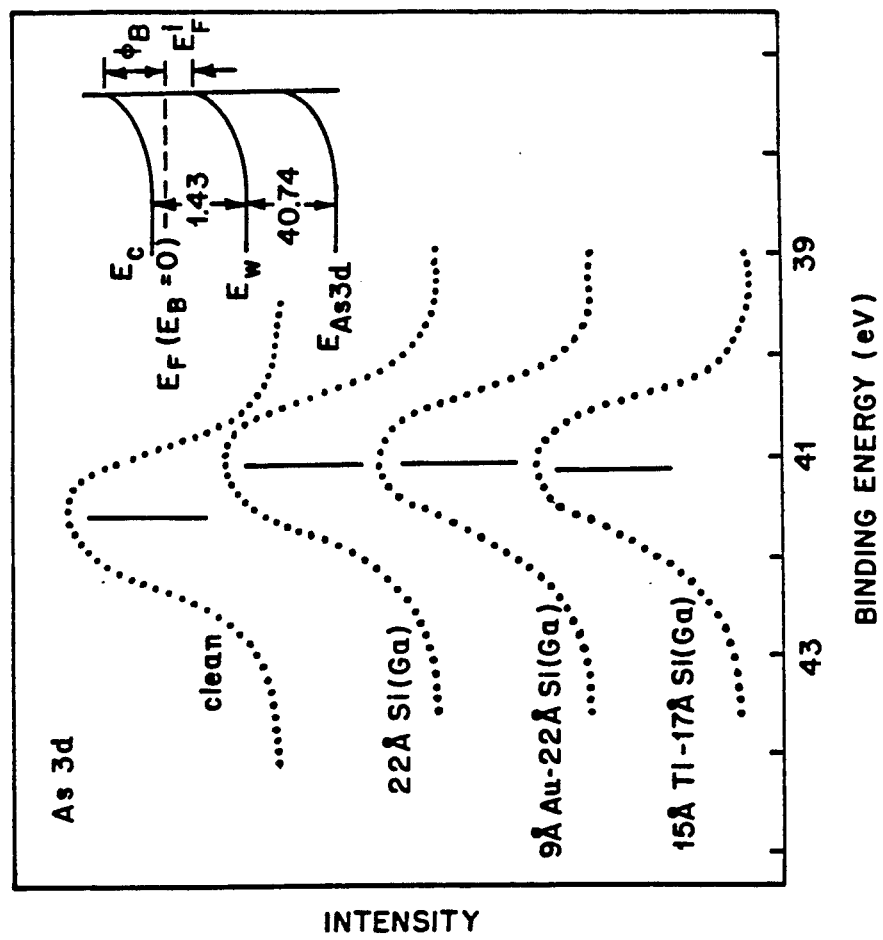
FIG. 1 illustrates XPS As 3d core level spectra for various thin overlayers on clean n-type GaAs (100) surfaces.

The As 3d curves in FIG. 1 illustrate how XPS was used to measure $E_F^i$ (and $\phi_B$) during contact interface formation. The top three peaks are for sequential treatments to the sample; the bottom peak is for the indicated two overlayers (peak heights are normalized). The inset in FIG. 1 depicts the relationship between the As 3d core level in GaAs at the interface and $E_F^i$ (the photoelectron escape depth is much smaller than the band bending depth). Thus, $E_F^i = E_{As}3d - 40.74$ eV, where $(E_{As}3d - E_v) = 40.74 \mp 0.03$ eV is the constant As 3d to valence-band maximum binding energy difference in GaAs (note that the XPS binding energy $E_B$ scale is zero at the sample Fermi energy). The vertical line indicating the center (midpoint of the width at half-maximum) of the clean surface As 3d peak at 41.58 eV therefore gives an $E_F^i$ (clean) measurement of 0.84 eV (the average value for four samples was 0.79 eV).

Deposition of 22 Å of Si(Ga) onto the clean GaAs surface caused a 0.51 eV decrease of the As 3d binding energy to 41.07 eV which gives $E_F^i = 0.33$ eV (compare upper two peaks in FIG. 1). Similar $E_F^i$ data for the other samples are listed in Table 1. Each sample has a low (0.33 eV) $E_F^i$ value after deposition of a Si(Ga) overlayer.

Is the low $E_F^i$ value of the Si(Ga)-GaAs interface retained after deposition of a contact metal? The third As 3d peak in FIG. 1 at 41.06 eV demonstrates that a 9 Å Au layer essentially did not change $E_F^i$ for the 22 Å Si(Ga) sample ($E_F^i = 0.32$ eV). Similarly, the bottom As 3d peak at 41.12 eV ($E_F^i = 0.38$ eV) is for a 15 Å Ti overlayer on the 17 Å Si(Ga)-GaAs interface. Thus, deposition of a metal does not increase the low $E_F^i$ value established by the Si(Ga) layer.

The $E_F^i$ measured with a metal overlayer is related to the Schottky barrier height (inset in FIG. 1) by $\phi_B = 1.43$

TABLE I

Schottky barrier height of metal contacts to GaAs that contain a thin Si(Ga) interface layer.

| Contact | $E_F^{ia}$ (eV) | $\phi_B^{XPS}$ (eV) | n | $\phi_B^{IVb}$ (eV) | $\phi_B^{CV}$ (eV) |
|---|---|---|---|---|---|
| Au-22 Å Si(Ga) | 0.33 | 1.11 | 1.08 | 1.01 | 1.01 |
| Cr-28 Å Si(Ga) | 0.41 | ... | 1.11 | 0.99 | 1.10 |
| Ti-17 Å Si(Ga) | 0.39 | 1.05 | 1.11 | 0.98 | 1.14 |
| Ti-26 Å Si(Ga) | 0.47 | 1.01 | 1.10 | 0.97 | 1.06 |
| Au-ideal | | | 1.05 | 0.89 | |
| Cr-ideal | | | 1.05 | 0.76 | |
| Ti-ideal | | | 1.04 | 0.83 | |

$^a$Si(Ga) layer only.
$^b$Includes + 0.04 eV image force correction.

eV $-E_F^i$. The values $\phi_B^{XPS}$ for the Au and Ti samples are given in Table I [the Cr $\phi_B^{XPS}$ could not be measured because the As 3d and Cr 3p peaks overlap and there was an additional 0.05 eV decrease in $E_F^i$ at the 26 Å Si(Ga)-GaAs interface upon Ti deposition]. Thus, XPS measurements show that thin metal contacts to Si(Ga)-GaAs interfaces have 1 eV Schottky barrier heights.

Representative I-V data for the thick metal Cr-28 Å Si(Ga) and Ti-17 Å Si(Ga) contacts are plotted in FIG. 2 [the Au-22 Å Si(Ga) data are not shown because of overlap with the Cr-Si(Ga) data]. For comparison, I-V data for ideal contacts of these metals (metal deposited onto clean GaAs surface) are also shown. A substantial increase in barrier height is evident for the contacts with the Si(Ga) interlayer. The I-V data were analyzed with respect to the thermionic emission model for current transport:

$$I = I_s \exp(zV/nkT)[1 - \exp(-zV/kT)]A$$

where the ideality factor n (~1.02 is ideal) and $I_s$ were determined by a least-squares fit. The Schottky barrier height $\phi_B^{IV}$ is related to $I_s$ by $I_S = SA^*T^2 \mathrm{Xexp}[-q(\phi_B^{IV}-\Delta\phi)/KT]A$, where S is the contact area, $A^* = 8.16$ is the effective Richardson constant, and $\Delta\phi = 0.04$ eV is the calculated image force correction. The corresponding C-V data for each contact, taken at 1 MHz over a +0.2 to -2.0 V range, were analyzed according to the conventional model that gives $\phi_B^{CV}$ in terms of the intercept $V_i$ (found by a least-squares fit) on the voltage axis of a $1/C^2$ vs V plot. There were no significant deviations from linearity in these $1/C^2$ vs V plots. Table I lists the average values of n, $\phi_B^{IV}$, and $\phi_B^{CV}$ for each metal-Si(Ga) sample (~10 contacts per sample, $\leq \pm 0.01$ eV estimated measurement uncertainty). The $\phi_B^{IV}$ for the corresponding ideal contact is also given.

The electrical measurements on the thick contacts confirm the 1.0 eV barriers measured by XPS. Why $\phi_B^{CV}$ is ~0.1 eV larger than $\phi_B^{IV}$ for the Cr-Si(Ga) and Ti-Si(Ga) contacts is unexplained but is most likely an artifact of the C-V model used; the close agreement of the values for the Au-Si(Ga) contact shows this difference is not an intrinsic feature of the metal-Si(Ga)-GaAs interface. For this reason the $\phi_B^{IV}$ values will be considered the most accurate measure of the barrier height. The ideality factors are acceptably low. The increased $\phi_B$ for the metal-Si(Ga) contact compared to the respective ideal contact ranges from 0.1 eV (Au) to 0.23 eV (Cr). In addition, the metal-Si(Ga) $\phi_B$ is independent of the contact metal, which is in contrast with ideal contacts to GaAs.

The XPS results demonstrate that the large $\phi_B$ is caused by a low $E_F^i$ created at the Si(Ga)-GaAs interface which remains after deposition of a thick contact metal. This method of achieving a large barrier contact is thus distinct from methods in which an effective barrier height is controlled by tailoring the impurity profile, and hence the potential, in the GaAs depletion region near a metal-GaAs interface where $\phi_B$ itself is fixed.

The critical factor for achieving a low $E_F^i$ at Si-GaAs interfaces is that the Si be heavily p-type. In principle the Si layer should not be depleted. We have also produced low $E_F^i$ interfaces with boron-doped Si deposited at 200° and 350° C. in vacuum. Thus neither the kind of p dopant nor the precise substrate temperature is a crucial parameter. The nonepitaxial nature of the Si and large lattice mismatch with GaAs also indicates that interface perfection need not be approached to obtain a low $E_F^i$. Furthermore, a large $E_F^i=1.23$ eV value was recently reported for the Si(As)-GaAs interface grown at 250° C. Thus, $E_F^i$ is unpinned and can be varied up to ~0.9 eV at Si-GaAs interfaces by making the Si either p or n type. This observation suggests that the lower limit to $E_F^i$ values at Si-GaAs interfaces may be set by where the Si valence-band maximum falls within the GaAs band gap (that is, the Si-GaAs heterojunction valence-band offset $/\Delta E_v$). A $\Delta E_v$ of 0.23 $\pm$0.1 eV has been measured, which is fairly close to the $E_F^i$ values for the metal-Si(Ga)-GaAs contacts.

These results offer a possible basis for understanding the high barrier measured for thick amorphous Si-Ge-B contacts to GaAs. If heavily p-type material in intimate contact with the GaAs was produced by the chemical vapor deposition process that was used, the $E_F^i$ may have been unpinned in the same way as at the Si(Ga)-GaAs interfaces described here.

In summary, the $\phi_B$ of metal contacts to GaAs can be increased to 1.0 eV by inclusion of a very thin 15–30 Å Si(Ga) interface layer to control $E_F^i$. The metals investigated were Au, Cr, and Ti. The increased $\phi_B$ for these metals (compared to ideal contacts) ranges from 0.1 to 0.23 eV. Thus, use of the Si(Ga) layer also makes $\phi_B$ independent of the contact metal. Because of the diverse properties of Au, Cr, and Ti, we expect that other metals will also exhibit an increased $\phi_B$ when used in a similar metal-Si(p-type)-GaAs contact structure.

Clearly, many modifications and variations of the present invention are possible in light of the above teachings and it is therefore understood, that within the inventive scope of the inventive concept, the invention may be practiced otherwise than specifically claimed.

What is claimed is:

1. In a semiconductor device, said semiconductor device having a base layer, a contact to said base layer having a Schottky barrier height about 1 eV, said contact comprising:
    a metallic layer;
    an interface layer, said interface layer having said metallic layer deposited thereon, said interface layer being composed of a Group IV element heavily doped p-type; and
    a III-V compound base layer, 2. A contact as defined in claim 8 wherein said metallic layer is composed of a metal selected from the group consisting of gold, chromium and titanium.

3. A contact as defined in claim 1 wherein said III-V compound is selected from the group comprising gallium arsenide and indium phosphide.

4. A contact as defined in claim 1 wherein said interface layer comprises silicon.

5. A contact as defined in claim 4 wherein said interface layer is heavily doped p-type with a element selected from the group comprising gallium and boron.

6. A contact as defined in claim 1 wherein said interface layer has a thickness of about 15 to about 30 angstroms.

7. A contact as defined in claim 1 wherein said contact comprises a metallic layer comprising a metal selected from the group comprising gold, chromium and titanium; said interface layer being about 15 to about 30 angstroms thick and heavily doped p-type with gallium and said base layer is composed of gallium arsenide whereby a Schottky barrier height is about 1 eV.

8. A contact as defined in claim 1 wherein said metallic layer is metal.

* * * * *

UNITED STATES PATENT AND TRADEMARK OFFICE
CERTIFICATE OF CORRECTION

PATENT NO. : 4,999,685

DATED : 12 March 1991

INVENTOR(S) : James R. Waldrop et al.

It is certified that error appears in the above-identified patent and that said Letters Patent is hereby corrected as shown below:

Col. 1, title, delete "SCHOTIKY" and insert -- SCHOTTKY -- therein.

Col. 1, line 16, delete -- - -- after "metal".

Col. 2, line 10, insert -- of -- after "because".

Col. 2, line 16, insert -- s -- after "exhibit".

Col. 3, line 14, the second "2" is a subscript.

Col. 4, line 20, delete "z" and insert -- q -- thereof in two places.

Col. 4, line 24, delete "K" and insert -- k -- therein.

Col. 5, line 14, delete "Offer" and insert -- offer -- therein.

UNITED STATES PATENT AND TRADEMARK OFFICE
CERTIFICATE OF CORRECTION

PATENT NO. : 4,999,685
DATED : 12 March 1991
INVENTOR(S) : James R. Waldrop, et al It is certified that error appears in the above-indentified patent and that said Letters Patent is hereby corrected as shown below:

IN THE DRAWINGS

In Figure 1, in the upper right, delete "$E_W$" and insert --$E_V$-- .

Signed and Sealed this

Sixteenth Day of April, 1996

BRUCE LEHMAN

Attest:

Attesting Officer

Commissioner of Patents and Trademarks